United States Patent
Chen et al.

(10) Patent No.: US 7,499,347 B2
(45) Date of Patent: Mar. 3, 2009

(54) SELF-TIMING CIRCUIT WITH PROGRAMMABLE DELAY AND PROGRAMMABLE ACCELERATOR CIRCUITS

(75) Inventors: Zhiqin Chen, San Diego, CA (US); Chang Ho Jung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 155 days.

(21) Appl. No.: 11/614,828

(22) Filed: Dec. 21, 2006

(65) Prior Publication Data

US 2008/0037338 A1 Feb. 14, 2008

Related U.S. Application Data (60) Provisional application No. 60/836,779, filed on Aug. 9, 2006.

(51) Int. Cl.
 *G11C 7/00* (2006.01)
(52) U.S. Cl. .................. 365/194; 365/196; 365/210; 365/233
(58) Field of Classification Search ............... 365/194, 365/196, 210, 233

See application file for complete search history.

(56) References Cited

U.S. PATENT DOCUMENTS

| | | | | |
|---|---|---|---|---|
| 5,471,428 A | * | 11/1995 | Baroni et al. | ............... 365/201 |
| 6,172,916 B1 | * | 1/2001 | Ooishi | .................... 365/189.02 |
| 6,646,938 B2 | * | 11/2003 | Kodama | ................ 365/210.14 |

* cited by examiner

*Primary Examiner*—Connie C Yoha
(74) *Attorney, Agent, or Firm*—Nicholas J. Pauley; Joseph B. Agusta; Sam Talpalatsky (57) ABSTRACT

A memory has a novel self-timing circuit that generates internal memory control signals. Control signals may include an address latch enable signal, a decoder enable signal, and a sense amplifier enable signal. The circuit has a timing loop whose timing mimics the timing of an access of the real memory. The timing loop includes dummy bit cells of identical construction to bit cells in the real array being accessed, a programmable delay circuit, and a programmable accelerator circuit. The dummy bit cells cause the timing of the control signals to track speed changes in the memory array being accessed. The programmable delay and accelerator circuits are usable to slow or speed the timing loop. The programmable delay and accelerator circuits are usable to achieve a desired yield to memory access speed tradeoff. Flexibility of the timing loop allows a memory to be designed before memory access timing characteristics are fixed.

25 Claims, 3 Drawing Sheets

FIG. 1

SELF-TIMING CIRCUIT

SELF-TIMING CIRCUIT WITH PROGRAMMABLE DELAY AND PROGRAMMABLE ACCELERATOR CIRCUITS

CROSS-REFERENCE TO RELATED APPLICATION

This application claims the benefit under 35 U.S.C. §119 of Provisional Application Ser. No. 60/836,779, filed Aug. 9, 2006, said provisional application is incorporated herein by reference.

BACKGROUND INFORMATION

1. Technical Field

The disclosed embodiments relate to self-timing circuits that generate internal memory control signals in semiconductor memory devices.

2. Background Information

One conventional type of semiconductor memory device is a static random access memory (SRAM) that involves an array of bit cells organized in rows and columns. Each row of bit cells has an associated word line. Each column of bit cells has an associated pair of bit lines. Each pair of bit lines is coupled to a sense amplifier. If the sense amplifier detects a positive differential voltage between its pair of bit lines, then the sense amplifier outputs a first digital logic value. If, on the other hand, the sense amplifier detects a negative differential voltage between the pair of bit lines, then the sense amplifier outputs a second digital logic value opposite the first digital logic value.

In a read operation, an address is placed on address input leads of the memory and a read/write signal is setup on a R/W input lead to indicate a read operation. Upon an edge of a clock signal, the address is latched into an address latch. Bit line precharge is disabled. The address is decoded such that a word line enable signal is supplied onto one of the word lines indicated by the address. The bit cells of the row then output their respective data values. Each bit cell causes the voltage between its associated pair of bit lines to have either a positive voltage or a negative voltage. It takes time for a bit cell to discharge or charge the capacitance of its bit lines such that the positive or negative voltage is of sufficient magnitude to be properly read by the sense amplifier. Once an adequate amount of time has passed, then a sense amplifier enable signal is supplied to the sense amplifiers. The sense amplifier enable signals cause the sense amplifiers to sense the differential voltages on the bit lines and to output the corresponding digital data values for the addressed row from the memory. If the time between the edge of the clock signal and the sense amplifier enable signal is too short, then the magnitude of the differential voltages may be too small and the sense amplifiers may output erroneous data. On the other hand, if the time between the edge of the clock signal and the sense amplifier enable signal is longer than necessary, then the access time of the memory is lengthened unnecessarily. The amount of time required for the accessed bit cells to drive the bit lines to adequate differential voltages is not constant, but rather varies with memory size, process, voltage and/or temperature.

In this type of SRAM, a circuit sometimes referred to as "self-timing circuit" generates the sense amplifier enable signal and other control signals such that the sense amplifiers are not enabled too early or unnecessarily late. The self-timing circuit uses the delay of a signal propagation path to time the assertion of the sense amplifier enable signal. The signal propagation path is made to mimic the signal propagation paths through the real memory array from the edge of the clock signal until the addressed bit cells have driven adequate differential voltages onto their respective pairs of bit lines in the real memory array. If the signal propagation path in the self-timing circuit is like the signal propagation paths in the real memory, then as the process, voltage and/or temperature (PVT) changes and affects the signal propagation paths through the real memory array, the signal propagation path in the self-timing circuit will be affected in the same way. If, for example, process, voltage and/or temperature changes reduce the rate at which bit cells in the real memory array can drive their corresponding bit lines to appropriate voltage levels, then the same process, voltage and/or temperature changes will slow the signal propagation path in the self-timing circuit resulting in an appropriately delayed assertion of the sense amplifier enable signal.

One self-timing circuit technique uses a dummy word line, a column of dummy bit cells and one or two dummy bit lines to model corresponding signal paths in the real memory array. The dummy bit cells are made to have identical layouts to the bit cells in the real memory array, and the resistances and capacitances of the dummy word line and dummy bits lines are made to be the same as the resistances and capacitances of the real word lines and real bit lines in the real memory array so that the effects of process, voltage and temperature on the signal propagation paths in the self-timing circuit and in the real memory array will track one another closely. Another self-timing circuit technique does not employ word line, bits cells and bit lines of the same layout as in the real memory array to mimic the signal propagation path in the real memory array, but rather employs high threshold voltage N-channel pull down field effect transistors (FETs) to pull-down on a timing node in the self-timing circuit. The signal propagation delay through the self-timing circuit is made to match the signal propagation delay through the real memory array by changing the number of these pull down transistors that are made conductive and are pulling down on the timing node.

Once the sense amplifiers have been enabled and have output correct digital logic values, the output data can be latched. Once the output data is latched, the sense amplifiers can be disabled to reduce power consumption of the memory. If, however, the address latch were made transparent for the next memory cycle too early with respect to disabling of the sense amplifiers, then the sense amplifiers may erroneously change the values they are outputting at the end of the prior memory read operation. To prevent this, a conventional self-timing circuit may involve gating circuitry for extending the duration of the address latch enable signal. In one example, an inverted version of the unextended address latch enable signal is supplied onto one input lead of a NAND gate. The inverted unextended address latch enable signal is delayed by passing it through a chain of an even number of inverters. The delayed signal is supplied onto a second input lead of the NAND gate. The NAND gate outputs the extended address latch enable signal that is used to control the address latch. The delay introduced by the chain of inverters serves to extend the amount of time that the address latch enable signal is a digital logic high value.

SUMMARY

A memory has a novel self-timing circuit. The novel self-timing circuit receives a signal (for example, an edge of a clock signal) and in response generates internal memory control signals that cause data to be read from or written to bit cells in the memory. The memory control signals may, for example, include an address latch enable signal (also called an address latch enable/disable signal), a decoder enable signal (also called a decoder enable/disable signal), a sense amplifier enable signal, and a bit line precharge control signal. The self-timing circuit has a timing loop whose timing is made to mimic the timing of an access of bit cells in the real memory array. This timing loop includes a sequential logic element, a dummy word line, one or more dummy bit cells of identical construction to bit cells in the real array being accessed, a dummy bit line, and special circuitry that is used to programmably change the speed of the timing loop. The dummy word line, dummy bit cells, and dummy bit line cause the timing of the internal control signals to track speed changes (speed changes caused by memory configuration, process, voltage and/or temperature variations) of the memory array being accessed. For example, the amount of time between assertion of the decoder enable signal (DEC_EN) and the sense amplifier enable signal (SEN) is automatically increased by the self-timing loop if the amount of time required to access the dummy bit cells is detected by the self-timing loop to have increased. On the other hand, the amount of time between assertion of the decoder enable signal and the sense amplifier enable signal is automatically decreased by the self-timing loop if the amount of time required to access the dummy bit cells is detected by the self-timing loop to have decreased. Because the time to access the dummy bit cells is made to mimic the time required to access bit cells in the real memory array, assertion of the sense amplifier enable signal as supplied by the self-timing loop to the real memory array is timed appropriately.

In one example, the circuitry for programmably changing the speed of the timing loop includes a programmable delay circuit and a programmable accelerator circuit. Control signals are supplied to the programmable delay circuit to control the amount of propagation delay introduced into the signal path of the self-timing loop by the programmable delay circuit. Control signals are supplied to the programmable accelerator circuit to control the degree to which the accelerator circuit accelerates the self-timing loop. The control signals supplied to the programmable delay circuit and the programmable accelerator circuit can be set under software control or can be hardwired depending on the implementation. In one novel method, the programmable delay and accelerator circuits are usable to change the speed of the self-timing loop to achieve a desired yield to memory access speed tradeoff. Memories of a single design can be graded and/or separated into two groups by appropriate control of the self-timing circuit: a first group can be made to have faster access times, whereas a second group can be made to have slower access times. Flexibility of the timing loop allows a memory to be designed before memory access timing characteristics are fixed or are known. Where a silicon compiler program is used to fashion different formats and configurations of memories, the self-timing circuit is incorporated into each memory design so that timing of the self-timed control signals can be adjusted as appropriate for the particular design and memory array to be accessed.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

DETAILED DESCRIPTION

Figure 1:
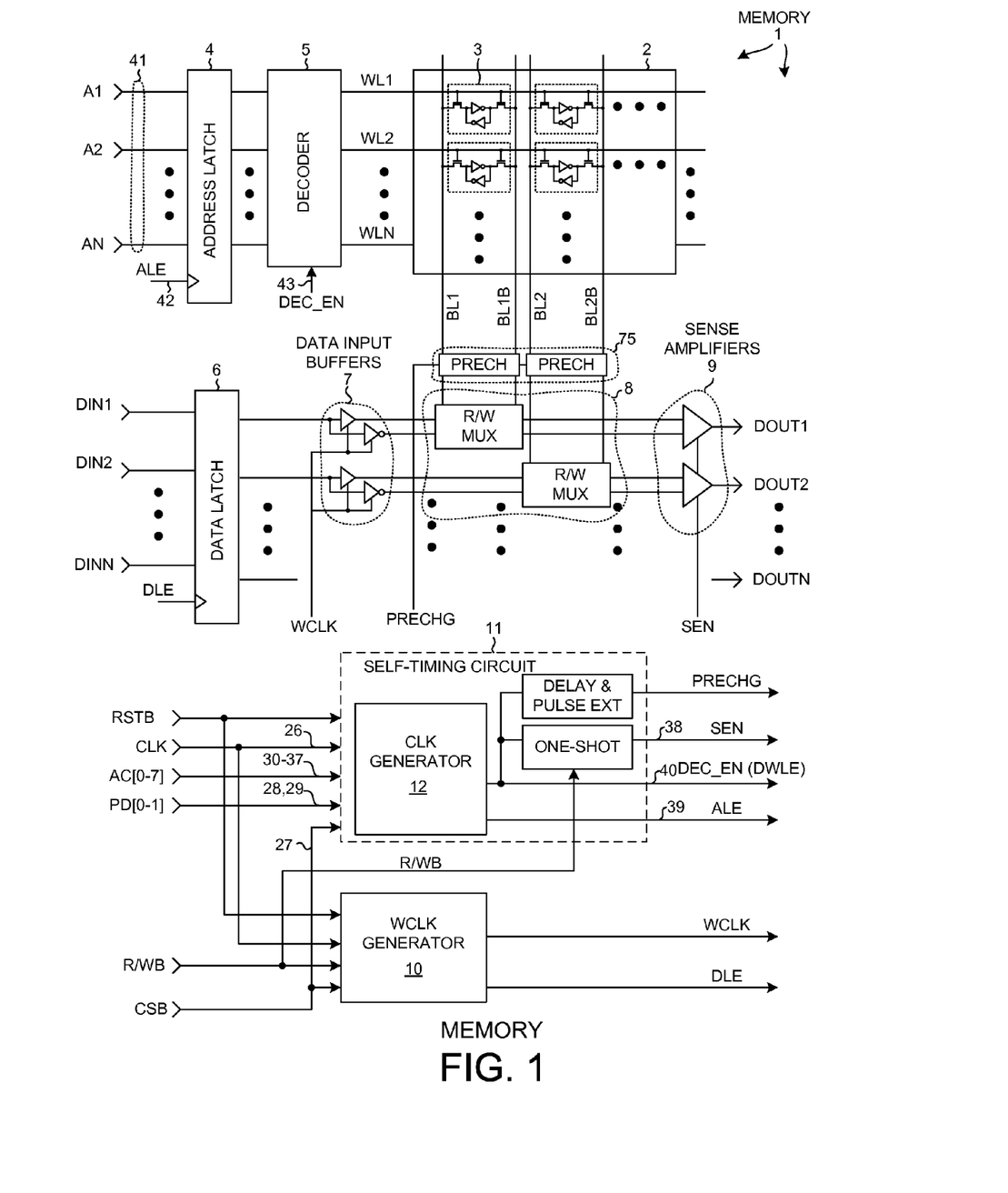
FIG. 1 is a simplified diagram of a memory device 1 in accordance with one novel aspect.

FIG. 1 is a simplified diagram of a semiconductor memory integrated circuit device 1. Memory device 1 is a static random access memory (SRAM). Memory device 1 includes an array 2 of bit cells 3 that are arranged in rows and columns. Each row of bit cells has an associated horizontally extending word line. The word lines are designated WL1 through WLN in the figure. Each column of bit cells has an associated pair of vertically extending bit lines. In the diagram, the leftmost pair of bit lines is designed BL1 and BL1B and the next leftmost pair of bit lines is designated BL2 and BL2B. As illustrated, each bit cell is a six-transistor cell and involves a cross-coupled pair of inverters and a pair of access transistors. Memory device 1 also includes an address latch 4, a row decoder 5, a data input latch 6, data input buffers 7, read/write multiplexers 8, sense amplifiers 9, precharge circuits 75, a write clock generator circuit 10, and a self-timing circuit 11.

Figure 2:
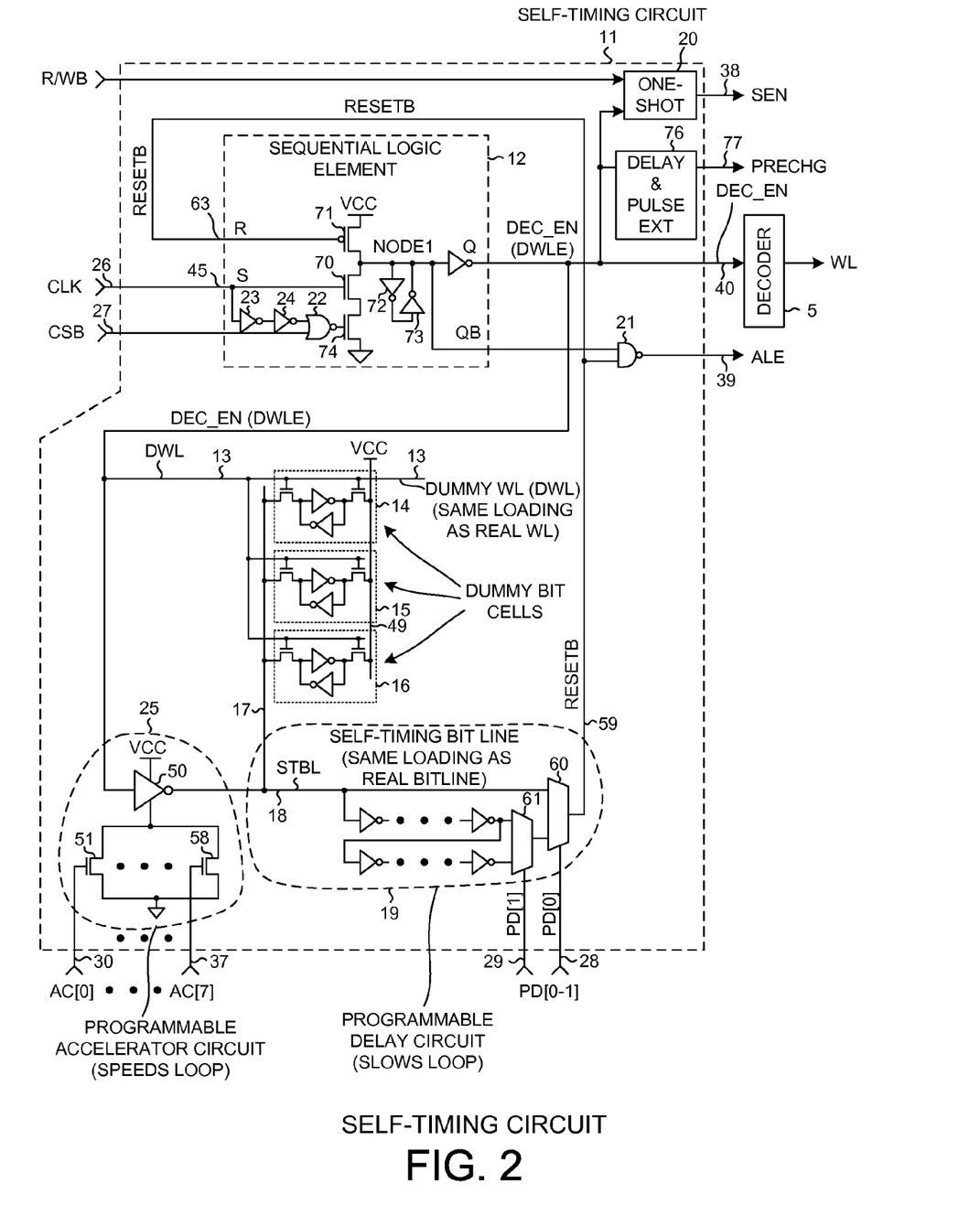
FIG. 2 is a simplified diagram of the self-timing circuit 11 in the memory device 1 of FIG. 1.

FIG. 2 is a more detailed diagram of the self-timing circuit 11 of FIG. 1. Self-timing circuit 11 includes a sequential logic element 12, a dummy word line 13, three dummy bit cells 14-16, two dummy bit lines 17 and 49, a self-timing bit line (STBL) node 18, a programmable delay circuit 19, a falling-edge triggered one-shot circuit 20, a logic gate 21, a delay and pulse extension circuit 76, and a programmable accelerator circuit 25.

Self-timing circuit 11 receives an input clock signal (CLK) on an input lead 26, receives an active low input chip select signal (CSB) on an input lead 27, receives a first multi-bit digital control value on control input leads 28-29, and receives a second multi-bit digital control value on control input leads 30-37. Self-timing circuit 11 outputs a sense amplifier enable signal (SEN) on an output lead 38, outputs an address latch enable (ALE) signal on an output lead 39, outputs a decoder enable signal (DEC_EN) on an output lead 40, and outputs a precharge signal (PRECHG) on an output lead 77. The decoder enable signal is also referred to as a dummy word line enable (DWLE) signal. In the signal naming convention used, a "B" at the end of signal name indicates that the signal is an active low signal.

Figure 3:
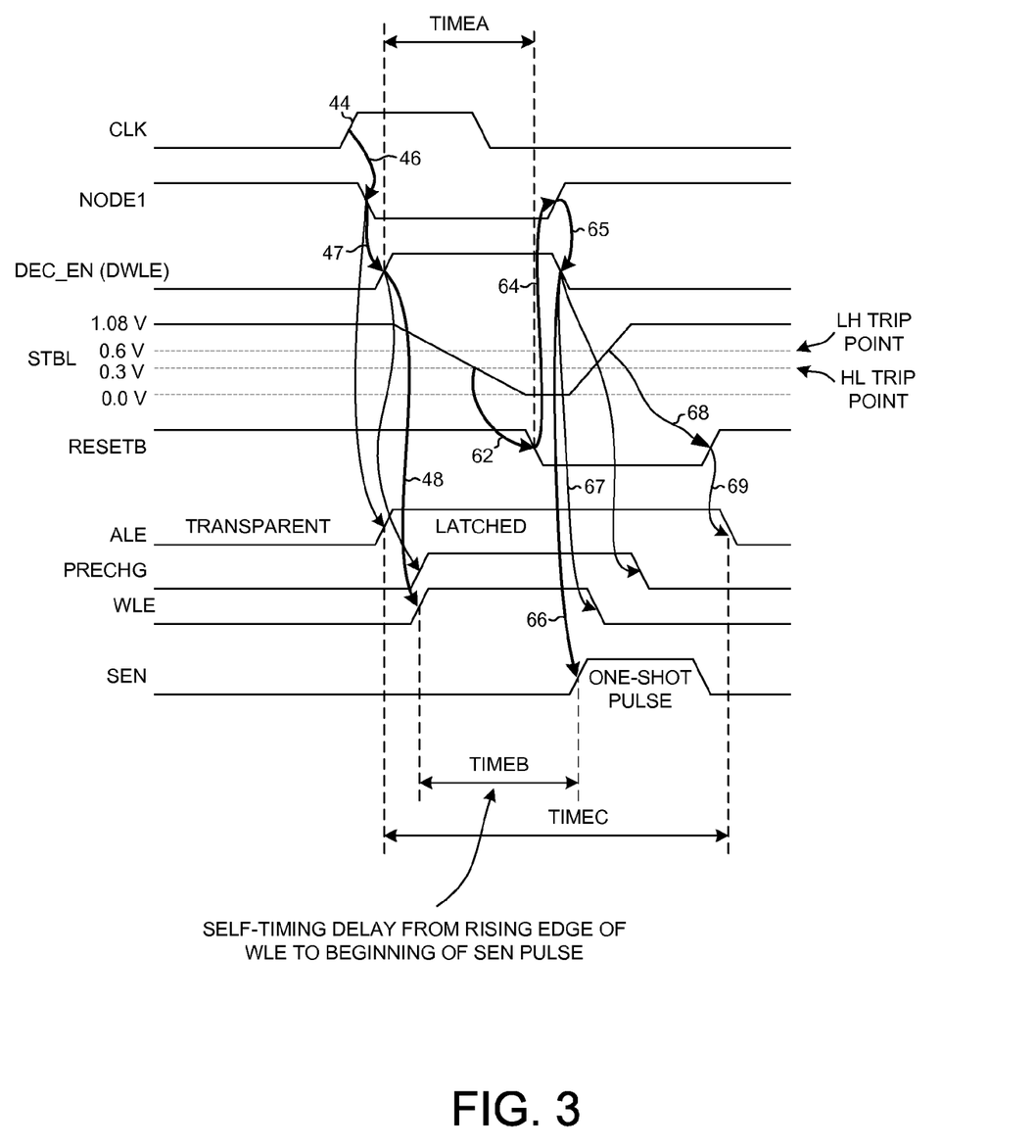
FIG. 3 is a simplified waveform diagram that illustrates operation of the self-timing circuit 11 of FIG. 2 in a self-timed memory read access operation.

FIG. 3 is a simplified waveform diagram that illustrates an operation of memory device 1 and its self-timing circuit 11 in a read operation. Initially, before the rising edge of the clock signal (CLK), an N-bit address (A1-AN) is placed on the N address input leads 41 of address latch 4. When the signal on enable input lead 42 of latch 4 is a digital logic low level, then latch 4 is transparent and the signals on input leads 41 flow through the latch to the output leads of the latch. When the signal on enable input lead 42 transitions from a digital logic low to a digital logic high, then latch 4 latches and holds the digital logic values on its output leads. In the initial condition illustrated in FIG. 3, ALE is at a digital logic low level and latch 4 is transparent. The N-bit address therefore passes through latch 4 and is present on the N input leads of decoder 5. The decoder enable signal DEC_EN on the enable input lead 43 of decoder 5 is, however, at a digital logic low level. Decoder 5 is therefore disabled and decoder 5 cannot assert a word line enable signal onto any of the word lines WL1 through WLN. None of the bit cells of array 2 is therefore addressed or outputting data. During this initial time, the bit lines of each pair of bit lines of array 2 are precharged so that both bit lines of the pair have the same voltage. The sense amplifier enable (SEN) signal is a digital logic low so sense amplifiers 9 are not enabled. The read/write signal (R/WB) that is supplied as an input to the memory device 1 is a digital logic high to indicate that the upcoming memory access operation is a read operation and not a write operation. Memory device 1 is enabled, so the active low chip select signal (CSB) is asserted to a digital logic low value.

The clock signal CLK is a digital logic low level, so the gate of N-channel pulldown transistor 70 within sequential logic element 12 is non-conductive, thereby decoupling node NODE1 from ground potential. The signal RESETB is similarly at a digital logic high, so P-channel pullup transistor 71 is also nonconductive, thereby decoupling node NODE1 from supply voltage VCC. In this initial condition, cross-coupled inverters 72 and 73 keep NODE1 latched to maintain a digital logic high value.

Next, the clock signal CLK transitions from a digital logic low value to a digital logic high value. This edge 44 of clock signal CLK while signal CSB is low causes both N-channel pulldown transistors 70 and 74 to be conductive momentarily before the digital logic high on the set input lead 45 can propagate through inverters 23 and 24 and through NOR gate 22 to turn transistor 74 off. Internal node NODE1 of the sequential logic element is therefore set to a digital logic low. This is indicated by arrow 46 in FIG. 3. The Q and QB outputs of sequential logic element 12 are digital logic high and low values, respectively. The Q output of sequential logic element 12 is coupled to dummy word line 13. The decoder enable signal DEC_EN on dummy word line 13 is therefore asserted high as indicated by arrow 47 in FIG. 3. DEC_EN transitioning high generates a precharge control signal PRECHG on lead 77 that in turn stops the precharging of the bit lines within array 2. DEC_EN is also supplied via output lead 40 to the enable input lead of decoder 5 of memory array 2. The high level of DEC_EN causes decoder 5 to assert a word line enable signal onto one of the word lines. This is indicated by arrow 48 and the low-to-high transition of the signal WLE in FIG. 3. When the word line enable WLE signal is present on a word line, the bit cells within array 2 that are coupled to the word line are accessed and begin driving their associated bit lines. Each of these bit cells drives a differential voltage onto its corresponding pair of bit lines so that this differential voltage can later be detected by the associated sense amplifier as a digital logic high or low value. In the memory device of FIG. 1, one entire row of bit cells is accessed in parallel at one time. The assertion of the decode enable signal DEC-EN therefore initiates the accessing of memory array 2.

Within self-timing circuit 11, the assertion of DEC_EN to a digital logic high value causes the voltage on dummy word line 13 in self-timing circuit 11 to transition to a digital logic high level. All three of the dummy bit cells 14-16 are therefore accessed and begin driving the dummy bit lines 17 and 49 so that a differential voltage is present between the two dummy bit lines. Bit line 49 is permanently coupled to supply voltage VCC. In the illustrated embodiment, the voltage on the self-timing bit line STBL node 18 starts at 1.08 volts, and then due to the action of dummy bit cells 14-16 decreases as illustrated in FIG. 3.

Programmable accelerator circuit 25 is programmable to assist the dummy bit cells 14-16 in decreasing the voltage on STBL node 18. Programmable accelerator circuit 25 includes a CMOS inverter 50. The source of the P-channel pullup transistor within inverter 50 is coupled to the supply voltage VCC in normal fashion. The source of the N-channel pull-down transistor within inverter 50, on the other hand, is coupled to a ground conductor through a plurality of pull-down transistors 51-58 called footer transistors. The gate of each of the footer transistors 51-58 is coupled to a corresponding one of control input leads 30-37 such that each of the footer transistors 51-58 can be made conductive or non-conductive independently of the others. How many of the footer transistors 51-58 are controlled to be conductive determines the current sinking capability of inverter 50 when inverter 50 is outputting a digital logic low onto STBL node 18. If none of footer transistors 51-58 is made conductive, then inverter 50 cannot sink any current from STBL node 18 and accelerator circuit 25 does not assist the dummy bit cells 14-16 in decreasing the voltage on STBL node 18. In the example above where DEC_EN is a digital logic high, inverter 50 sinks current from STBL node 18 and therefore assists dummy bit cells 14-16 in decreasing the voltage on STBL node 18. (The sinking of current from STBL node 18 can be considered a supplying of a negative current onto STBL node 18).

In the example of FIG. 2, there are three possible signal paths from STBL node 18 through programmable delay circuit 19 to reset conductor 59. Each of these signal paths has a different propagation delay. The first signal path, which is selected if PD[0] is a digital logic zero, extends from STBL node 18, through the upper data input lead of 2:1 multiplexer 60 to the output lead of multiplexer 60, and to reset conductor 59. The second signal path, which is selected if PD[0] is a digital logic one and PD[1] is a digital logic zero, extends from STBL node 18, through a first chain of inverters, through the upper data input lead of 2:1 multiplexer 61 to the output of multiplexer 61, through the lower data input lead of 2:1 multiplexer 60, and to reset conductor 59. The third signal path, which is selected if PD[0] is a digital logic one and PD[1] is a digital logic one, extends from STBL node 18, through the first chain of inverters, through a second chain of inverters, through the lower data input lead of 2:1 multiplexer 61 to the output of multiplexer 61, through the lower data input lead of multiplexer 60 to the output lead of multiplexer 60, and to reset conductor 59. Regardless of which of the three paths is selected, the first digital logic element that the signal passes through has a HL trip point voltage (i.e., high-to-low trip point voltage). In the embodiment illustrated, the HL trip point voltage is approximately 300 millivolts. Until the voltage on STBL node 18 falls below this HL trip point voltage, the first digital logic element does not switch and the signal output by programmable delay element 19 does not switch logic levels. When the voltage on STBL node 18 reaches the HL trip point voltage, then the digital logic element switches and the new digital logic value propagates through programmable delay circuit 19 and onto reset conductor 59. This is indicated by arrow 62 in FIG. 3. The result is the transitioning of the signal RESETB on reset conductor 59 from a digital logic high value to a digital logic low value. The delay introduced by programmable delay circuit 19 can be selected and changed by appropriate control of the control signals PD[0-1].

The RESETB signal on conductor 59 is supplied onto the active low reset input lead 63 of sequential logic element 12. At this time, the pulldown path of NODE1 is disabled. The low logic level of the signal RESETB on reset input lead 63 resets sequential logic element 12 so that a digital logic high is forced onto internal node NODE1. This is indicated by arrow 64 in FIG. 3. A digital logic low level is output on the Q output lead of sequential logic element 12 and a digital logic high level is output on the QB output lead of sequential logic element 12. The signal DEC_EN therefore transitions low as indicated by arrow 65 in FIG. 3. The transitioning low of DEC_EN on dummy word line 13 causes dummy bit cells 14-16 to stop sinking current from self-timing bit line node 18. The transitioning low of DEC_EN on the dummy word line 13 also causes inverter 50 to start sourcing current onto STBL node 18 and driving the voltage on STBL node 18 upwards. The voltage on STBL node 18 therefore begins to increase as illustrated in FIG. 3.

The transitioning low of DEC_EN also triggers the falling edge triggered one-shot circuit 20. This is illustrated by arrow 66 in FIG. 3. One-shot 20 responds by outputting a high pulse of the sense amplifier enable SEN signal onto output lead 38. SEN transitioning high enables sense amplifiers 9. Each of the sense amplifiers detects the differential voltage on one pair of bit lines and outputs either a digital logic high value or a digital logic low value depending on the polarity of the differential voltage. The amount of time TIMEB (self-timed delay) from low-to-high transition of the word line enable WLE signal to the assertion high of the sense amplifier enable SEN signal can be increased by controlling the programmable delay circuit 19 to increase the propagation delay between STBL node 18 and reset conductor 59. As process, voltage and/or temperature (PVT) changes speed or slow the ability of the real bit cells in array 2 to drive the real bit lines to the appropriate differential voltages for detection by sense amplifiers 9, the same PVT changes similarly speed or slow the ability of dummy bit cells 14-16 to drive the dummy bit line 17 and STBL node 18 to the HL trip point voltage for detection by programmable delay circuit 19. If more time is required for the real bit cells to drive their bit lines to the appropriate differential voltages, then self-timing circuit 11 increases the time "TIMEB" a similar amount. Similarly, if less time is required for the real bit cells to drive their bit lines to the appropriate differential voltages, then self-timing circuit 11 decreases the time "TIMEB" a similar amount. The time "TIMEB" is therefore said to be "self-tracking".

Once sense amplifiers 9 have been enabled and have output the data values from memory device 1, the output data is latched (by output latches not illustrated). Once the data is latched, sense amplifiers 9 are disabled to reduce power consumption of memory device 1. In the circuit of FIG. 2, the same high-to-low DEC_EN signal transition that triggers one-shot 20 and initiates assertion of the SEN pulse also disables decoder 5 and causes the word line enable signal WLE to be deasserted to a low digital logic value. The propagation delay through decoder 5 is made to be slightly longer than the propagation delay through one-shot 20 so that WLE transitions low slightly after the sense amplifiers have been enabled. Arrow 67 in FIG. 3 illustrates the propagation delay through decoder 5. Note that WLE transitions low slightly after SEN transitions high.

Once the voltage on STBL node 18 reaches a low-to-high trip point voltage (LH trip point voltage) of the programmable delay circuit 19, then the signal propagates through the programmable delay circuit 19 and onto reset conductor 59 after a propagation delay. (In the present example, the LH trip point is approximately 0.6 volts, but in another embodiment the LH and HL trip points are the same 300 millivolt trip point voltage.) The signal RESETB transitions high as illustrated by arrow 68 in FIG. 3. Sequential logic element 12 is therefore no longer held in the reset state. Self-timing circuit 11 is then ready to be triggered again by another rising edge of the signal CLK for another self-timed memory access operation.

In addition to self-timing the assertion of the sense amplifier enable signal SEN, self-timing circuit 11 also extends the trailing high-to-low edge of the address latch enable ALE pulse. If ALE were allowed to transition back low before the end of the read operation, then address latch 4 would become transparent, another address could pass onto the input leads of decoder 5, and decoder 5 could cause an incorrect word line enable signal to be asserted. As a result, incorrect data could start to be read out of array 2. If this were to occur prior to the data from the prior read operation being latched on the output of memory device 1, then incorrect data could be latched. Even if incorrect data is not output from the memory, the undesired beginning of a second access of memory array 2 could interfere with memory operation of the first operation. To prevent this, NAND gate 21 holds ALE to a digital logic high value as long as RESETB has a digital logic low value. This serves to extend the high ALE pulse. As illustrated by arrow 69 in FIG. 3, when RESETB transitions high then NAND gate 21 deasserts ALE to a digital logic low value. ALE is maintained at a digital logic high value until after the sense amplifier enable SEN signal has returned to a digital logic low value.

In the illustrated embodiment, during an ordinary read operation from memory array 2, only one bit cell drives a pair of bit lines. In order for the sense amplifier to be assured of reading the differential voltage between the bit lines correctly, the differential voltage must be at least 200 millivolts in magnitude. The propagation delay time from the rising edge of CLK until there is a 200 millivolt differential voltage on the sense amplifier inputs in the real array is to be matched by the propagation delay time in the self-timing circuit 11 from the rising edge of CLK until the voltage on STBL node 18 has fallen to the HL trip point of the programmable delay circuit. Also, the propagation delay from the rising edge of word line enable WLE to the rising edge of the sense amplifier enable signal SEN is to be matched to the propagation delay from the rising edge of dummy word line enable (DWLE) to the falling edge of RESETB. The voltage of STBL node 18 has to fall from 1.08 volts to 300 millivolts, whereas the differential voltage between bit lines in the real array only has to change by approximately 200 millivolts. Because the dummy bit cells 14-16 have the identical or substantially identical layout and circuit structure as the real bit cells within array 2, the current driving capabilities of a dummy bit cell is substantially the same as the current driving capability of a real bit cell in array 2. In order to make the time when the voltage on the sense amplifier inputs in array 2 are of a proper 200 millivolt magnitude the same approximate point in time as the time when the voltage on STBL node 18 is at the HL trip point of programmable delay circuit 19, three dummy bit cells are used in parallel to drive dummy bit line 17.

The electrical signal transmission characteristics (distributed resistance and distributed capacitance and total resistance and total capacitance) of the dummy word line 13 and dummy bit lines 17 and 49 are substantially identical to the electrical signal transmission characteristics of the word and bit lines in memory array 2. In one example, the layout of dummy word line 13 is the same as the layout of the real word lines in array 2, and the layout of dummy bit lines 17 and 49 is identical to the layout of a corresponding pair of real bit lines in memory array 2.

In the illustrated embodiment, TIMEA from the rising edge of DEC_EN to the falling edge of RESETB is approximately the STBL fall time plus seven gate delays.

TIMEB from the rising edge of WLE to the rising edge of SEN is approximately the STBL fall time plus four gate delays. TIMEC from the rising edge of ALE to the falling edge of ALE is approximately the STBL fall time plus the STBL rise time plus thirteen gate delays.

In a write operation, the active low chip select signal CSB is set up with a digital logic low level and the read/write signal R/WB is set up with a digital logic low level to indicate that the next operation is to be a write operation and not a read operation. Bit line precharging in array 2 takes place when the DEC_EN signal is at a digital logic low level. When the clock signal CLK transitions from low to high, sequential logic element 12 is set, DEC_EN transitions high, and bit line precharging is disabled. The setting of sequential logic element 12 causes address latch enable ALE signal to transition high, thereby latching the incoming address in address latch 4. Assertion of the decoder enable DEC_EN signal high enables decoder 5 so that a word line enable signal is driven onto an addressed one of the rows of bit cells of array 2. The rising edge of the clock signal CLK also causes WCLK generator 13 (see FIG. 1) to assert a data latch enable DLE signal high and to latch the incoming data into data input latch 6. The latched data passes into array 2 through data input buffers 7 and R/W multiplexers 8. Corresponding differential voltages are impressed on each pair of bit lines and the differential voltages cause the addressed row of bit cells to be written with the incoming data. At the appropriate time, self-timing circuit 11 forces the self-timed RESETB signal low which in turn deasserts DEC_EN to a digital logic low level, which in turn disables decoder 5 and turns off the access transistors of the addressed bit cells in array 2. DEC_EN transitioning low also initiates bit line precharging for the next memory access operation. Because the changes in the amount of time to discharge STBL node 18 to the HL trip point roughly track the changes in the amount of time required to write data into bit cells in array 2, the self-timing circuit 11 changes the duration of the write operation in a self-timing manner.

By appropriate control of programmable accelerator circuit 25 and programmable delay circuit 19, times TIMEA, TIMEB and TIMEC can be increased or decreased in order to achieve a desired memory access margin. Programmable accelerator circuit 25 and programmable delay circuit 19 can be used to decrease times TIMEA, TIMEB and TIMEC step by step until memory access failures occur and are detected. In the early stage of developing a new memory architecture or a new semiconductor fabrication process, self-timing circuit 11 is usable to slow down the self-timed loop to increase memory access times. The self-timing loop can then be accelerated, step by step, until memory failures occur and are detected. Failure analysis information is obtained in this way by studying when and how memory access failures occur with respect to changes in the speed of the self-timing loop. Self-timing circuit 11 is usable in production memory integrated circuits to achieve a desired tradeoff between manufacturing yield and memory access times. If higher yields are desired, then the self-timing circuits in the memory integrated circuits are controlled to have a slower self-timing loop. Because a higher percentage of manufactured memory dice can function properly in this slower memory access condition, manufacturing yields are higher. If, on the other hand, lower memory access times are desired, then the self-timing circuits in the memory integrated circuits are controlled to have a faster self-timing loop. Only a lower percentage of manufactured memory dice can function properly in this faster memory access condition, so manufacturing yields are lower. The control signals supplied to the programmable delay circuit and the programmable accelerator circuit can be set under software control or can be hardwired depending on the implementation. Where a silicon compiler program is used to fashion different formats and configurations of memories, the self-timing circuit 11 is incorporated into each memory design so that timing of the self-timed control signals (for example, DEC_EN and ALE and SEN) can be adjusted as appropriate for the particular design. Flexibility of the timing loop allows a memory to be designed using the silicon compiler before the memory access speeds and characteristics of the bit cells are known and/or before the semiconductor process used to manufacture the memory is mature. The flexibility of being able to speed or slow the self-timing signals allows the timing control loop to be adjusted under software control as appropriate later in the memory design cycle or even after memory manufacture.

Although certain specific embodiments are described above for instructional purposes, the teachings of this patent document have general applicability and are not limited to the specific embodiments described above. Programmable mechanisms other than the specific programmable delay circuit and programmable accelerator circuits described above can be employed to provide an ability to programmably change the timing of the self-timing loop. A self-timing loop can be made with a programmable accelerator circuit but with no programmable delay circuit, or alternatively a self-timing lop can be made with a programmable delay circuit and no programmable accelerator circuit. Although the delay between the rising edge of the CLK signal and the beginning of the SEN pulse in the specific embodiment above involves discharging of an STBL node down to a HL trip point voltage, other embodiments can be realized that involve charging an STBL node up to a LH trip point voltage. In some embodiments, a dummy sense amplifier or another comparator is used as an input stage in a programmable delay circuit to sense differential voltages on dummy bit lines or on a single-ended dummy bit line node. Accordingly, various modifications, adaptations, and combinations of the various features of the described specific embodiments can be practiced without departing from the scope of the claims that are set forth below.

What is claimed is:

1. A circuit comprising:
a sequential logic element that is set to a first state upon receipt of an edge of a first signal, wherein the sequential logic element asserts a second signal when the sequential logic element is in the first state, wherein the sequential logic element deasserts the second signal when the sequential logic element is in a second state;
a self-timing bit line node;
a dummy bit cell that begins to change a voltage on the self-timing bit line node in response to assertion of the second signal; and
a programmable delay circuit that receives a third signal from the self-timing bit line node and in response thereto asserts a fourth signal after a programmable delay, wherein assertion of the fourth signal causes the sequential logic element to be reset to the second state.

2. The circuit of claim 1, further comprising:
a one-shot that is triggered upon deassertion of the second signal to assert a fifth signal, wherein the fifth signal is a sense amplifier enable signal.

3. The circuit of claim 2, further comprising:
a word line; and
a word line decoder that receives the second signal and that outputs a sixth signal onto the word line, wherein the sixth signal is a word line enable signal.

4. The circuit of claim 3, wherein deassertion of the second signal causes the voltage on the self-timing bit line node to change such that the programmable delay circuit deasserts the fourth signal, the circuit further comprising:
an address latch that receives a seventh signal, wherein the seventh signal is an address latch enable signal, wherein the seventh signal is set to a first digital logic level in response to assertion of the second signal, and wherein the seventh signal is reset to a second digital logic level in response to deassertion of the fourth signal.

5. The circuit of claim 1, further comprising:
a programmable accelerator circuit having an input lead and an output lead, wherein the input lead receives the second signal, and wherein the output lead is coupled to the self-timing bit line node, wherein the programmable accelerator circuit assists the dummy bit cell in changing the voltage on the self-timing bit line node in response to assertion of the second signal.

6. The circuit of claim 5, wherein the programmable accelerator circuit has a control input lead, wherein the programmable accelerator circuit receives a digital control value onto the control input lead, wherein the voltage on the self-timing bit line node is changed at a rate in response to assertion of the second signal, and wherein the rate can be changed by changing the digital control value.

7. The circuit of claim 1, wherein the programmable delay circuit has a control input lead, wherein the programmable delay circuit receives a digital control value onto the control input lead, and wherein the programmable delay can be changed by changing the digital control value.

8. The circuit of claim 1, wherein the circuit is a memory, the circuit further comprising:
a bit line; and
a plurality of bit cells that can output data onto the bit line such that the data is output from the memory, wherein the dummy bit cell and each of the plurality of bit cells has a substantially identical circuit structure.

9. A method comprising:
receiving an edge of a clock input signal;
in response to said edge, asserting a word line enable signal on a dummy word line such that a dummy bit cell begins to switch a voltage on a self-timing bit line node;
in response to the voltage on the self-timing bit line node reaching a trip point voltage, asserting a sense amplifier enable signal after a programmable delay; and
supplying a digital control value onto a control input lead of a programmable delay circuit, wherein the programmable delay circuit has an input lead that is coupled to the self-timing bit line node, and wherein the programmable delay circuit outputs a reset signal after a first delay through the programmable delay circuit, wherein the first delay can be changed by changing the digital control value.

10. The method of claim 9, further comprising:
using the reset signal to trigger a one-shot such that the one-shot outputs the sense amplifier enable signal after a second delay, and wherein the programmable delay includes first delay through the programmable delay circuit and the second delay through the one-shot.

11. The method of claim 9, wherein the programmable delay can be changed by changing a digital control value.

12. The method of claim 9, further comprising:
using a programmable accelerator circuit to assist the dummy bit cell in switching the voltage on the self timing bit line node.

13. The method of claim 12, wherein the programmable accelerator circuit has a control input lead, the programmable accelerator circuit receiving a digital control value onto the control input lead, wherein the voltage on the self-timing bit line node is changed at a rate, and wherein the rate can be changed by changing the digital control value.

14. The method of claim 9, further comprising:
in response to assertion of the word line enable signal asserting an address latch enable signal;
supplying a digital control value onto a control input lead of a programmable delay circuit, wherein the programmable delay circuit has an input lead that is coupled to the self-timing bit line node, and wherein the programmable delay circuit outputs a reset signal after a first delay through the programmable delay circuit, wherein the first delay can be changed by changing the digital control value;
after the reset signal is output from the programmable delay circuit, deasserting the word line enable signal and causing the voltage on the self-timing bit line node to switch digital logic values; and
in response to the voltage on the self-timing bit line node switching digital logic values, deasserting the address latch enable signal.

15. The method of claim 9, further comprising:
generating an address latch enable signal pulse, wherein the pulse has a programmable duration.

16. A memory comprising:
a plurality of memory bit cells that are readable and writable; and
a self-timing circuit that receives a clock signal and in response thereto asserts a sense amplifier enable signal after a programmable delay, wherein the self-timing circuit comprises a dummy bit cell, a node and a programmable delay circuit, wherein the dummy bit cell and each of the plurality of memory bit cells have a substantially identical circuit structure, wherein a logic level on the node switches within a first amount of time, wherein the first amount of time depends at least in part on an amount of current supplied by the dummy bit cell onto the node, wherein a signal passes through the programmable delay circuit in a second amount of time, and wherein the programmable delay includes the first amount of time and the second amount of time.

17. The memory of claim 16, wherein the current is a negative current, and wherein the switching of the logic level involves decreasing the voltage on the node until a trip point of a digital logic element is reached.

18. The memory of claim 17, wherein the self-timing circuit farther comprises a programmable accelerator circuit, wherein the programmable accelerator circuit assists the dummy bit cell in decreasing the voltage on the node.

19. The memory of claim 16, wherein the current is a positive current, and wherein the switching of the logic level involves increasing the voltage on the node until a trip point of a digital logic element is reached.

20. The memory of claim 19, wherein the self-timing circuit farther comprises a programmable accelerator circuit, wherein the programmable accelerator circuit assists the dummy bit cell in increasing the voltage on the node.

21. The memory of claim 16, wherein the self-timing circuit receives a multi-bit digital control signal, and wherein the programmable delay can be changed by changing the multi-bit digital control signal.

22. A memory comprising:
a plurality of memory bit cells that are readable and writable; and
means for receiving a clock signal and in response thereto asserting a sense amplifier enable signal after a programmable delay, wherein the programmable delay includes an amount of time required for one or more dummy bit cells to switch a logic level on a node within the means, wherein each of said one or more dummy bit cells and each of the plurality of memory bits cells have a substantially identical circuit structure, and wherein the programmable delay is adjustable by changing a multi-bit digital control value.

23. The memory of claim 22, wherein the means is also for generating an address latch enable signal pulse, wherein the address latch enable signal pulse has a duration, and wherein the duration is adjustable by changing the multi-bit digital control value.

24. The memory of claim 22, wherein the means includes a programmable accelerator circuit that assists said one or more dummy bit cells in switching the logic level on the node.

25. The memory of claim 22, wherein the means includes a programmable delay circuit, the programmable delay circuit detecting when the logic level on the node has switched and then asserting a reset signal after a programmable delay, wherein assertion of the reset signal causes the sense amplifier enable signal to be asserted.

* * * * *

UNITED STATES PATENT AND TRADEMARK OFFICE
CERTIFICATE OF CORRECTION

| | | |
|---|---|---|
| PATENT NO. | : 7,499,347 B2 | |
| APPLICATION NO. | : 11/614828 | |
| DATED | : March 3, 2009 | |
| INVENTOR(S) | : Chen et al. | |

It is certified that error appears in the above-identified patent and that said Letters Patent is hereby corrected as shown below:

Column 12, line 46, claim 18: "farther comprises" to read as --further comprises--

Column 12, line 54, claim 20: "farther comprises" to read as --further comprises--

Signed and Sealed this
Seventeenth Day of May, 2011

David J. Kappos
*Director of the United States Patent and Trademark Office*